(12) United States Patent
Hosono et al.

(10) Patent No.: US 7,257,789 B2
(45) Date of Patent: Aug. 14, 2007

(54) LSI DESIGN METHOD

(75) Inventors: Toshikatsu Hosono, Kasugai (JP); Takashi Yoneda, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 207 days.

(21) Appl. No.: 11/014,814

(22) Filed: Dec. 20, 2004

(65) Prior Publication Data

US 2005/0278672 A1    Dec. 15, 2005

(30) Foreign Application Priority Data

Jun. 11, 2004    (JP)    ............... 2004-174722

(51) Int. Cl.
G06F 17/50    (2006.01)
(52) U.S. Cl. .................... 716/6; 716/4; 716/5
(58) Field of Classification Search ......... 716/4–6
See application file for complete search history.

(56) References Cited

U.S. PATENT DOCUMENTS

| | | | | |
|---|---|---|---|---|
| 5,381,524 A | * | 1/1995 | Lewis et al. ............... | 715/804 |
| 5,455,931 A | * | 10/1995 | Camporese et al. ........ | 713/501 |
| 6,005,416 A | * | 12/1999 | Beakes et al. ............. | 326/96 |
| 6,286,128 B1 | * | 9/2001 | Pileggi et al. ............. | 716/18 |
| 6,557,145 B2 | * | 4/2003 | Boyle et al. ............... | 716/2 |
| 6,594,805 B1 | * | 7/2003 | Tetelbaum et al. ......... | 716/5 |
| 6,647,540 B2 | * | 11/2003 | Lindkvist et al. .......... | 716/10 |
| 7,096,442 B2 | * | 8/2006 | Lu et al. .................... | 716/6 |
| 2005/0081171 A1 | * | 4/2005 | Kawano et al. ............ | 716/6 |
| 2005/0107970 A1 | * | 5/2005 | Franch et al. .............. | 702/79 |
| 2005/0138588 A1 | * | 6/2005 | Frenkil ...................... | 716/6 |

FOREIGN PATENT DOCUMENTS

JP    2001-196459    7/2001

* cited by examiner

Primary Examiner—Thuan V. Do
Assistant Examiner—Naum B. Levin
(74) Attorney, Agent, or Firm—Staas & Halsey LLP

(57) ABSTRACT

An LSI design method according to the present invention is to estimate a timing uncertainty in an early stage of design for each item of which an influence on timing is uncertain among respective items requiring consideration relating to establishment of timing; and define a timing margin in each design stage by using the timing uncertainty estimation result depending on whether or not an influence of the each item on timing has been determined, followed by proceeding with the design in the respective design stages accordingly. As such, according to the present invention, a timing uncertainty is estimated in an early stage of LSI design, followed by proceeding with the design by using the timing uncertainty as required.

9 Claims, 12 Drawing Sheets

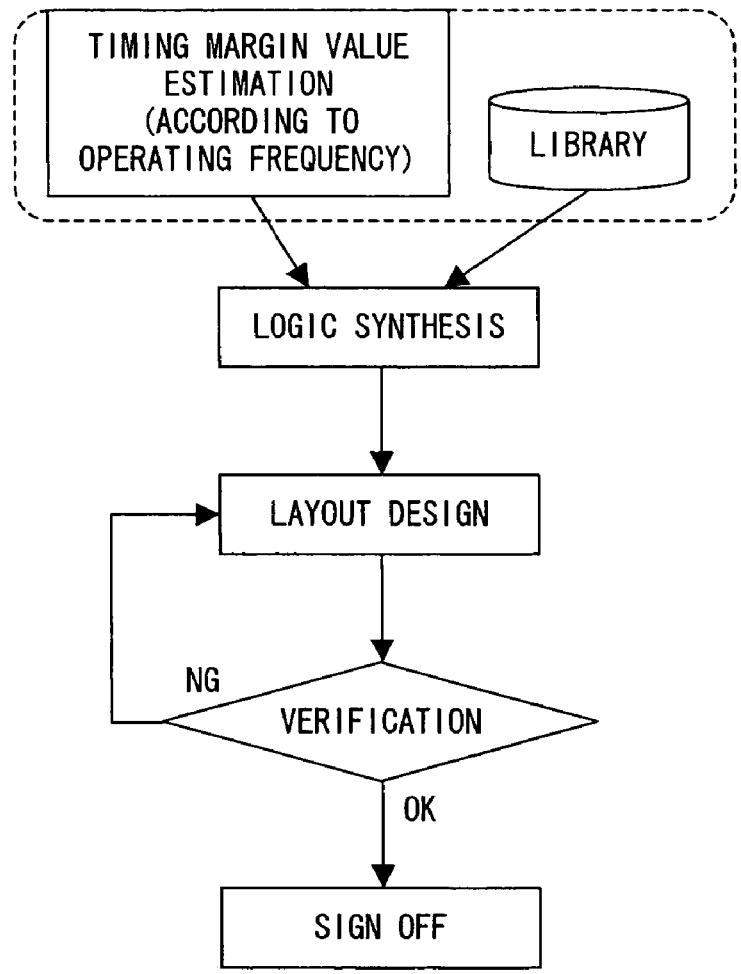
F I G. 1

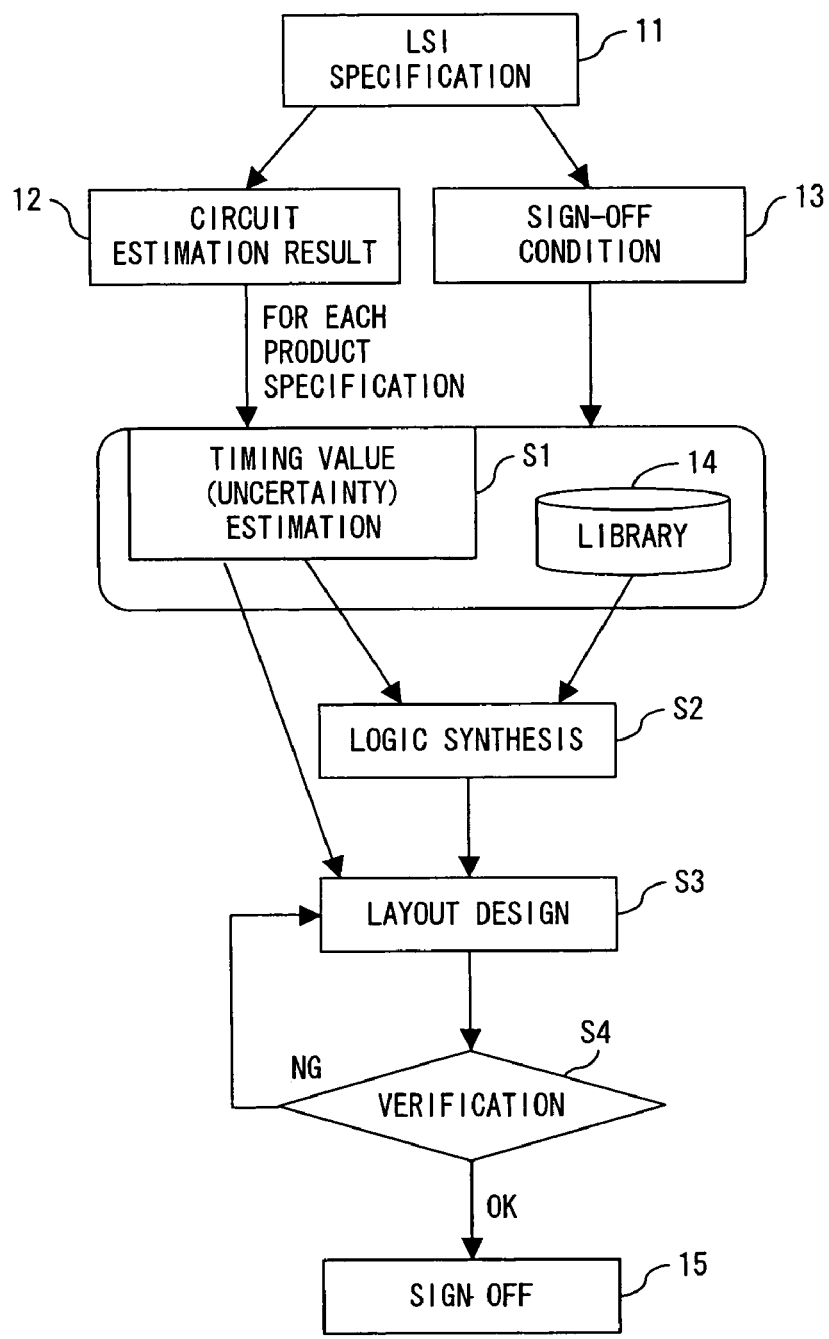
F I G. 3

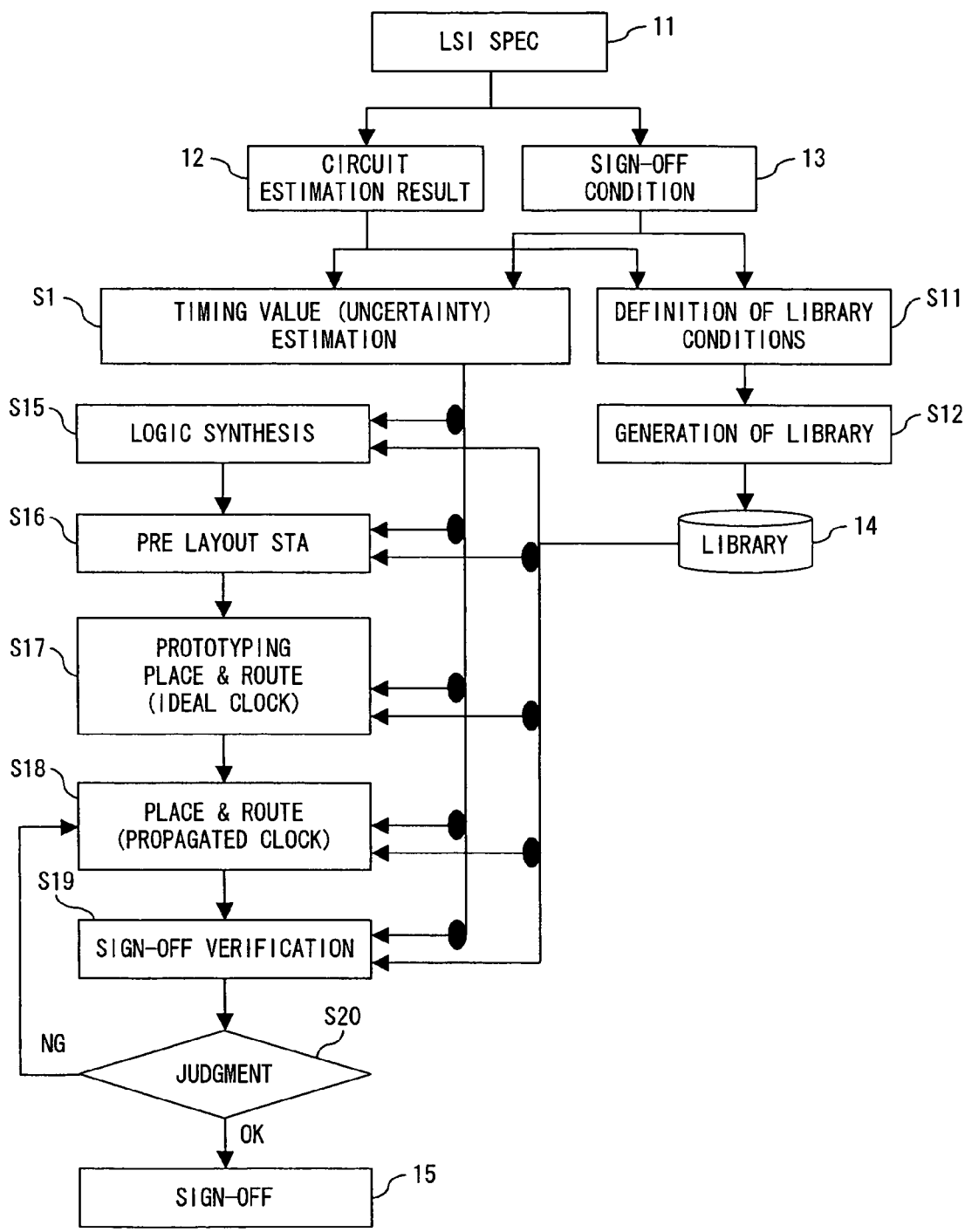
F I G. 4

FIG. 6

: ESTIMATE
*: CERTAINTY
+: USE SPEC. VALUE
−: NOT CONSIDERED

| | CLOCK SKEW | UNCERTAINTY | | | | LIBRARY |
|---|---|---|---|---|---|---|
| | | ON CHIP VARIATION | CROSSTALK DELAY | PLL JITTER | GAP BETWEEN TEMPORARY AND REAL WIRING | IRDROP |
| LOGIC SYNTHESIS (PRE LAYOUT STA) (S15, S16) | # | # | # | + | # | # |
| PROTOTYPING P&R (IDEAL) (S17) | # | # | # | + | − | * |
| P&R (PROPAGATED CK) (SET UP w/o CROSSTALK SDF) (S18) | * | # | # | + | − | * |
| P&R (PROPAGATED CK) (HOLD w/o CROSSTALK SDF) (S18) | * | # | # | − | − | * |
| SIGN-OFF (SETUP w CROSSTALK) (S19) | * | * | * | + | − | * |
| SIGN-OFF (HOLD w CROSSTALK) (S19) | * | * | * | − | − | * |

LSI DESIGN METHOD

CROSS-REFERENCE TO RELATED APPLICATIONS

This application is based upon and claims the benefit of priority from the prior Japanese Patent Application No. 2004-174722, filed in Jun. 11, 2004, the entire contents of which are incorporated herein by reference.

BACKGROUND OF THE INVENTION

1. Field of the Invention

The present invention relates to a design method for a semiconductor integrated circuit, specifically to a design method for LSI in which an uncertain amount of timing is adjusted while eliminating factors relative to determined timings during a design process thereof.

2. Description of the Related Art

In recent years, the design of a semiconductor integrated circuit is required for consideration of influences by an on-chip variation and a cross-talk, besides LSI for use in high speed operations, a convergence of timing has been increasingly difficult. This makes it important to establish an uncertain amount of timing ("timing uncertainty" hereinafter) as a timing margin. In the conventional common design method, however, a fixed timing margin has been established in the logic synthesis stage, followed by the design accordingly.

FIG. 1 shows a flow chart of such a conventional LSI design method. In FIG. 1, first a timing margin as common condition which does not depend on a product specification is established, as a margin responding to an operating frequency for example, and a logic synthesis is performed by using a library content which is stored characteristics of the cells, followed by repeating the above described steps until a layout design and a verification of the result are complete. When the result of the verification becomes OK, a sign-off is achieved and thus the product is transferred from the design process to a subsequent process.

In such a conventional LSI design process, a fixed timing margin has been established for all product specification in the logic synthesis stage and the design has been carried out accordingly. Since relationships among clock tree structure, layout process and sign-off condition have not been taken into consideration in establishing the timing margin, the last sign-off verification has been faced with a timing convergence problem, resulting in a numerous repetition of the layout design and the verification. Besides, since the conventional establishing method for timing margin has not taken a condition of a product specification into consideration, thus precluding a timing margin optimization in accordance with an applicable product specification or a reestablishment of margin even if each process is faced with a problem in timing convergence. Such has been the problem.

Such a conventional technique relating to a design method for a semiconductor integrated circuit is seen in the following document.

[Patent document 1] Japanese patent laid-open application publication 2001-196459 (P2001-196459A): "Design method and apparatus for a semiconductor integrated circuit"

This document has disclosed a design method for a semiconductor integrated circuit comprising a first step for temporarily defining a logic circuit having a required specification, a second step for calculating a timing margin in accordance with an operating frequency of the logic circuit and a third step for modifying a design parameter of the logic circuit temporarily defined in accordance with the calculated timing margin, and enabling a quick and appropriate design of a required semiconductor integrated circuit.

The technique disclosed in the document above, however, the timing margin is defined only in accordance with the operating frequency, therefore the method has been faced with a problem of precluding an adoption of this method if the customer requirement of operating frequency cannot be changed and an applicability of such timing margin common to all the design processes.

SUMMARY OF THE INVENTION

In consideration of the above described problems, an object of the present invention is to estimate an uncertain amount of timing margin in response to a series of items in the early design stage of a semiconductor integrated circuit, define an uncertainty of timing margin in response to the item of which an influence on timing is indeterminable in each design process and accordingly proceed with the design, thereby shortening the time to pass a verification for sign-off at the end of a design process.

In order to overcome the above described object, an LSI design method according to the present invention is to estimate timing uncertainty in an early stage of LSI design for each item of which an influence on timing is uncertain among respective items requiring consideration relating to establishment of timing; and define a timing margin value in each design stage by using the timing uncertainty estimation result depending on whether or not an influence of the each item on timing has been determined, followed by proceeding with the design in the respective design stages accordingly.

BRIEF DESCRIPTION OF THE DRAWINGS

FIG. 1 shows a flow chart of a conventional LSI design method;

FIG. 3 shows a basic process flow chart of an LSI design method according to the present invention;

FIG. 4 shows an overall process flow chart of an LSI design method according to the present embodiment;

FIG. 6 describes items required for consideration of a timing uncertainty in each design process;

DESCRIPTION OF THE PREFERRED EMBODIMENTS

Figure 2:
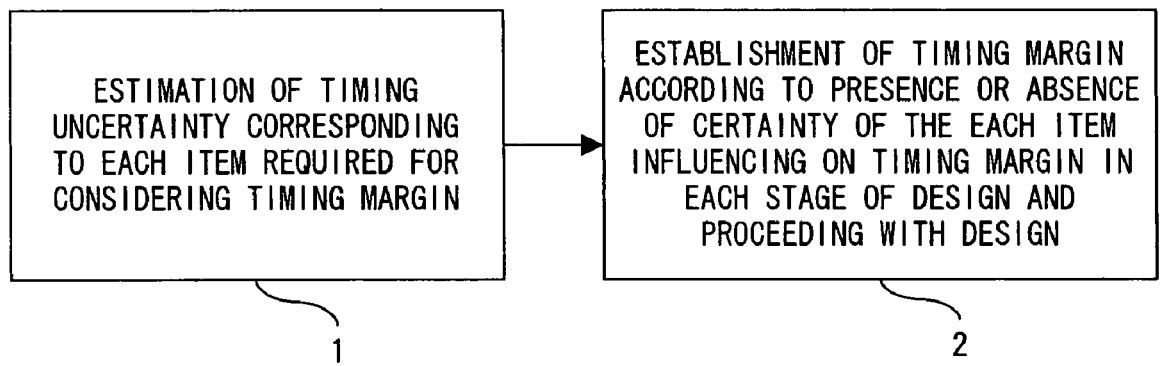
FIG. 2 shows a fundamental functional block chart of an LSI design method according to the present invention.

FIG. 2 shows a fundamental functional block chart of an LSI design method according to the present invention. In FIG. 2, first, step 1 estimates the timing uncertainty brought by the uncertain influences given by every item that has to be considered according to the establishment of the timing margin in an early stage of LSI design. And step 2 establishes a timing margin in each design stage of the LSI design based on the estimation result of the timing uncertainty, depending on whether or not an influence of the each item on timing has been determined. Then designs of each stage are carried out accordingly. In the present embodiment according to the invention, a timing uncertainty can also be estimated based on a condition of a product specification, an operating condition and a sign-off condition of an LSI in the step of the timing uncertainty estimation 1.

Also, in the estimation of a timing uncertainty influenced by a "Clock Skew" as one of items required for consideration in relation to timing margin establishment as described above, a judgment is given as to whether or not a "Clock Tree" structure is estimable and, if not, a timing uncertainty is estimated according to an operating frequency, while, if estimable, an timing uncertainty can also be estimated according to the operating frequency and the number of leaves in a "Clock Tree".

Next, in the estimation of a timing uncertainty influenced by an on-chip variation as one of the like items, if a "Clock Tree" structure is not estimable, a timing uncertainty is estimated corresponding to an operating frequency, while if the clock tree structure is estimable, then a timing uncertainty can also be estimated corresponding to an on-chip variation factor and a delay time in the path between a clock path branch to a cell being subjected to a timing check. The on-chip variation factor is estimated with consideration of variations possibly occurring in the chip, e.g., processing variation in the chip, and temperature or voltage fluctuation, or can also be estimated based on an operation assurance range, e.g., the temperature and voltage ranges, and on an IR drop as a product of a operating current for the LSI chip and a resistance of the supply source net.

Next, in the estimation of a timing uncertainty influenced by a "Crosstalk Delay" as one of the like items, it is also possible to estimate the timing uncertainty as follows. First, a factor value according to an operating frequency is assumed, next, judge whether or not a "Crosstalk" countermeasure condition is satisfied by the factor value, if satisfied, then the factor value is defined corresponding to the assumed factor value, and thereby a timing uncertainty is estimated.

And, in the estimation of a timing uncertainty influenced by a PLL jitter as one of the like items, it is also possible to estimate a timing uncertainty according to a PLL characteristic and the circuit configuration, e.g., an absence or presence of divider circuit.

Furthermore, in the estimation of a timing uncertainty influenced by a gap between a temporary and a real wirings, it is also possible to estimate the timing uncertainty as follows. First, it is judged whether or not an area estimation will be performed, and, if not, a timing uncertainty is estimated by defining a factor value corresponding to an operating frequency in accordance with a "Wire Load Model" in the library to be used, while if the area estimation is performed, then it is judged whether or not a subjected LSI-specific "Wire Load Model" will be made, and if not, estimate a timing uncertainty by defining the factor value according to a "Wire Load Model" in the library to be used and the area estimation result, while if the subjected LSI-specific Wire Load Model will be made, then it is estimated a timing uncertainty by defining a factor value corresponding to the specific "Wire Load Model".

Furthermore in the present invention, a program is used for making a computer operate as a computer program used for LSI designs which comprises the steps of estimating a timing uncertainty due to a fact that an influence of the item on the timing is indeterminable in establishing the timing corresponding to each item to be considered for establishing timing margin; and establishing a timing margin value based on the estimate result of the timing uncertainty depending on whether or not an influence of each of the items on the timing has been determined in each design stage, followed by proceeding with design in the respective stages accordingly. And in this embodiment according to the present invention, a computer readable portable memory medium for storing such a program is used.

According to the present invention as described above, a timing uncertainty is estimated corresponding to each item to be considered for establishing timing margin considering a condition of a product specification, an operating condition and a sign-off condition an LSI prior to the logic synthesis stage, then, in each of the subsequent design stages, a determinate value is used for the item of which an influence on the timing has been determined, while the already estimated timing uncertainty is used for the item of which an influence on the timing has not been determined.

FIG. 3 shows a basic process flow chart of an LSI design method according to the present invention. In FIG. 3, an LSI specification 11 provides a circuit estimation result 12 and a sign-off condition 13, and a library 14 for storing element (i.e., cell) characteristic and operating conditions, making a basis for design processing.

First in the step S1, by using the circuit estimation result 12 and the sign-off condition 13, a timing uncertainty is estimated based on a product specification of cell and its operating condition; in the step S2, a logic synthesis is performed by using the timing uncertainty and data being stored in the library 14. In the step S3, a layout design is carried out based on the logic synthesis result and the timing uncertainty; and in the step S4, a verification is conducted and, if the verification result is a fail, the layout design in the step S3 is resumed, while if the result is a pass, then a sign-off 15 is achieved.

FIG. 4 shows an overall process flow chart of an LSI design method according to the present invention. FIG. 4 shows a further detail added to the basic flow chart shown by FIG. 3. In FIG. 4, an LSI specification 11 provides a circuit estimation result 12 and a sign-off condition 13 as the case shown in FIG. 3, and a timing (uncertainty) is estimated by using the aforementioned information in the step S1. Meanwhile, in the step S11, a library condition is defined by a sign-off condition 13 based on the LSI specification 11, and in the step S12, a library is generated so as to set a content of library 14. At this time, the sign-off condition includes an operation range of the product category (PTV condition, P: process, T: temperature, V: volt), an IR drop amount and an on-chip variation. A library is generated based on these conditions in the step S11.

Subsequently, in the steps S15 through S20, those processes corresponding to the steps S2 through S4 shown in FIG. 3 are performed by using the timing (uncertainty) estimate value and the content of the library 14.

First, a logic synthesis in the step S15, a pre-layout STA (static timing analysis) in the step S16, a prototyping place & route in the step S17, a place & route in the step S18, a sign-off verification in the step S19 and a judgment of the sign-off verification in the step S20 are performed, respectively. If a judgment in the step S20 is a fail, the design process reverts back to the step S18, while if it is a pass, then a sign-off 15 is accomplished.

Note that the clock in the step S17 is handled by an ideal time, while in the step S18 the clock is handled by a propagated time based on the actual clock net.

Figure 5:
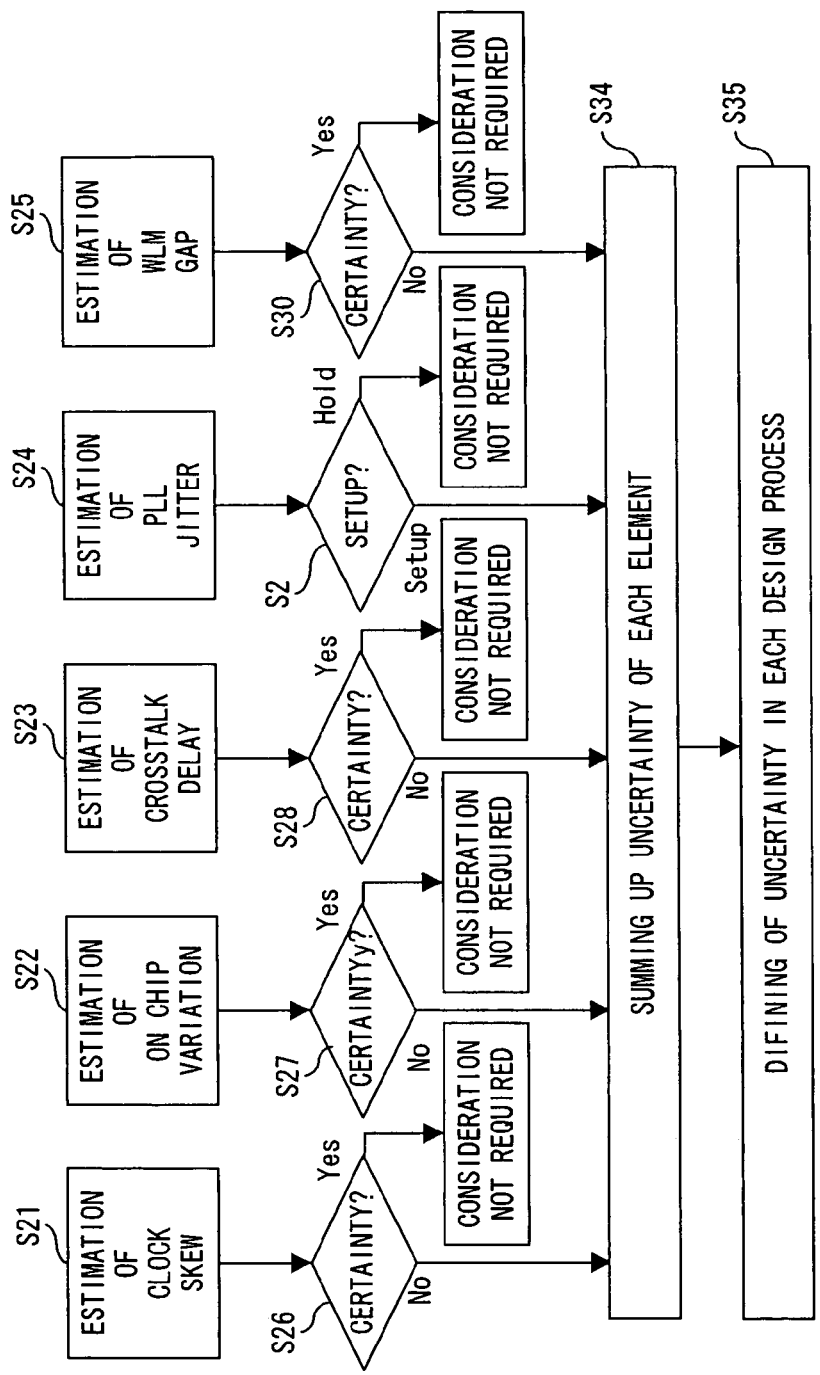
FIG. 5 shows a detail flow chart for estimating a timing value (a timing uncertainty) shown by FIG. 4.

FIG. 5 shows a detail flow chart for estimating a timing uncertainty in the step S1 shown by FIG. 4. The estimation of a timing uncertainty is basically done prior to a design processing in each design process as described in reference to FIG. 4, and a timing uncertainty is estimated corresponding to each item to be considered for establishing a timing margin. In each of the subsequent design processes, if a determined value of timing is available, the timing uncertainty corresponding to the item becomes unnecessary, so that summing up the timing uncertainty of items except for the aforementioned item will establish the overall timing uncertainty.

In other words, a timing uncertainty is estimated corresponding to each item to be considered for establishing the timing margin in the steps S21 through S25 as shown in FIG. 5. A timing uncertainty for each respective item is estimated for a "Clock Skew" in the step S21, an on-chip variation in the step S22, a "Crosstalk Delay" in the step S23, a PLL jitter in the step S24, and a "Wire Load Model" gap, i.e., an error for a temporary wiring against a real wiring, in the step S25.

Then, a judgment is given as to whether or not a timing for each item is determined in the steps S26 through S30, and if determined, the timing uncertainty for the item is no longer necessary for consideration and therefore summing up the timing uncertainty in the step S34 except for the aforementioned item and a timing certainty relative to the process is established in the step S35.

FIG. 6 describes a progress of determining timing margins in each design process. FIG. 6 shows whether or not the timing uncertainty is required for each item as shown by the steps S21 through S25 in FIG. 5 corresponding to each design process from the Logic Synthesis in the step S15 through the sign-off verification in the step S19 shown by FIG. 4. Note that the concept for a timing uncertainty is the same between the Logic Synthesis in the step S15 and the Pre-Layout STA in the step S16 and therefore the requirement in these two steps are commonly listed in a single row on the top.

In FIG. 6, if a timing is determined, "*" is marked, indicating that the determined value is to be used in the respective processes, while if a timing is not determined, "#" is marked indicating that a timing uncertainty value estimate is to be used in the respective processes, whereas for the PLL jitter, as described in detail later, "+" is marked indicating that a consideration is necessary in all the design processes, requiring to use the value of a characteristics evaluation test result, e.g., a value noted in a PLL characteristics sheet, while "−" is marked indicating that no consideration is necessary. As for estimation result for a gap between a temporary wiring and a real wiring, i.e., WLM gap in the step S25 shown in FIG. 5, a timing uncertainty estimation result is used in two processes, i.e., the Logic Synthesis in the step S15 and the Pre-Layout STA in the step S16 shown in FIG. 4, while indicating that there is no requirement for consideration in those processes S17 and thereafter.

Furthermore, a delay variation due to IR drop will be considered for a voltage condition of the Library 14 at the time of generating a library in the step S11. That is, the library is generated with a value subtracting a supply source voltage drop, defined by the current consumption and the resistance of the supply source net, from the voltage condition of the library.

By this, a contribution of supply source voltage drop to a degradation of delay is taken into consideration in the step S15 shown by FIG. 4 based on a storage content of the Library 14, and reflected on a result of the step S15 shown in FIG. 4. Also, since the library 14 is used also in the steps S16, S17, S18 and S19, the delay degradation can be treated equally in each step.

In FIG. 6, a PLL jitter is handled differently between the step S18 for checking a setup and the step S19 for checking a hold both shown by FIG. 4. Also shown in FIG. 6 are, "without crosstalk SDF (w/o crosstalk SDF)", i.e., a crosstalk delay for a standard display format not being considered, for the step S18 process, while "with crosstalk (w crosstalk)", i.e., a crosstalk being considered, for the step S19.

In the present embodiment as described, timings are estimated as prediction values, that is, uncertainty values corresponding to all the items until the process of "pre layout STA" and an estimated value is also used for the "IR drop amount."

Contrarily in the "prototyping P&R" (ideal Clock), since a cell arrangement is done, a wiring capacity is considered, it is not necessary to consider the gap with a temporary wiring. And in "P&R" (propagated clock), since a clock tree is structured, an influence of the clock skew is determined, while an uncertainty estimate value is used for each of items, an on-chip variation, a crosstalk delay and a PLL jitter.

In the last process, the sign-off verification, the influences of all the items on the timing are determined, and hence the verification are conducted by using the determinate values obtained by analyses. Note that since a supply source design is defined by the prototyping, a determinate value becomes usable for the IR drop in this process.

An overall description of the LSI design process according to the present embodiment is now complete with the above, and then a timing uncertainty estimation process corresponding to each item shown by FIG. 5 will be further described in reference to FIGS. 7 through 11.

Figure 7:
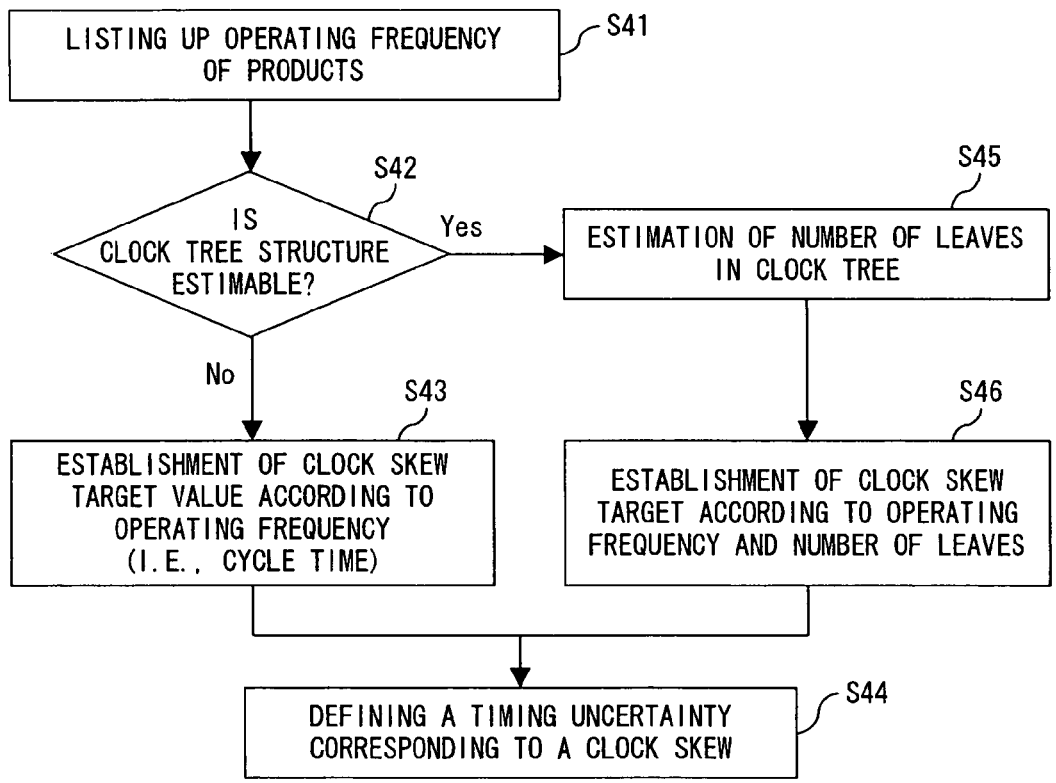
FIG. 7 shows a flow chart for defining a timing uncertainty corresponding to a clock skew.

FIG. 7 shows a detail flow chart for estimating a timing uncertainty corresponding to a "Clock Skew" in the step S21 shown in FIG. 5. In FIG. 7, as the process starts, first in the step S41, listing up operating frequency according to the product specification of LSI is done, followed by the step S42 for judging whether or not a "Clock Tree" structure is estimable. A "Clock Tree" structure can be estimated for a remake product for example. Except for such product, the estimation is generally not possible. However, it is effective to estimate a timing uncertainty as small as possible if a clock tree structure is estimable in order to avoid the estimated timing uncertainty from becoming large when a "Clock Tree" structure is not estimable.

In case a "Clock Tree" structure cannot be estimated, a target value of a timing uncertainty according to the operating frequency, that is, a "Clock Skew" corresponding to the cycle time, e.g., 5 to 10% of the cycle time, is set in the step S43, followed by the step S44 in which the timing uncertainty is defined accordingly.

In case a "Clock Tree" structure can be estimated in the step S42, the number of leaves in the "Clock Tree" is estimated in the step S45, a timing margin target value is set corresponding to a "Clock Skew" corresponding to the number of the leaves and the operating frequency in the step S46. This target value is set according to a predefined rule according to the operating frequency and the number of leaves for instance, followed by the step S44 in which the aforementioned value is defined for the timing uncertainty, thus ending this process.

Figure 8:
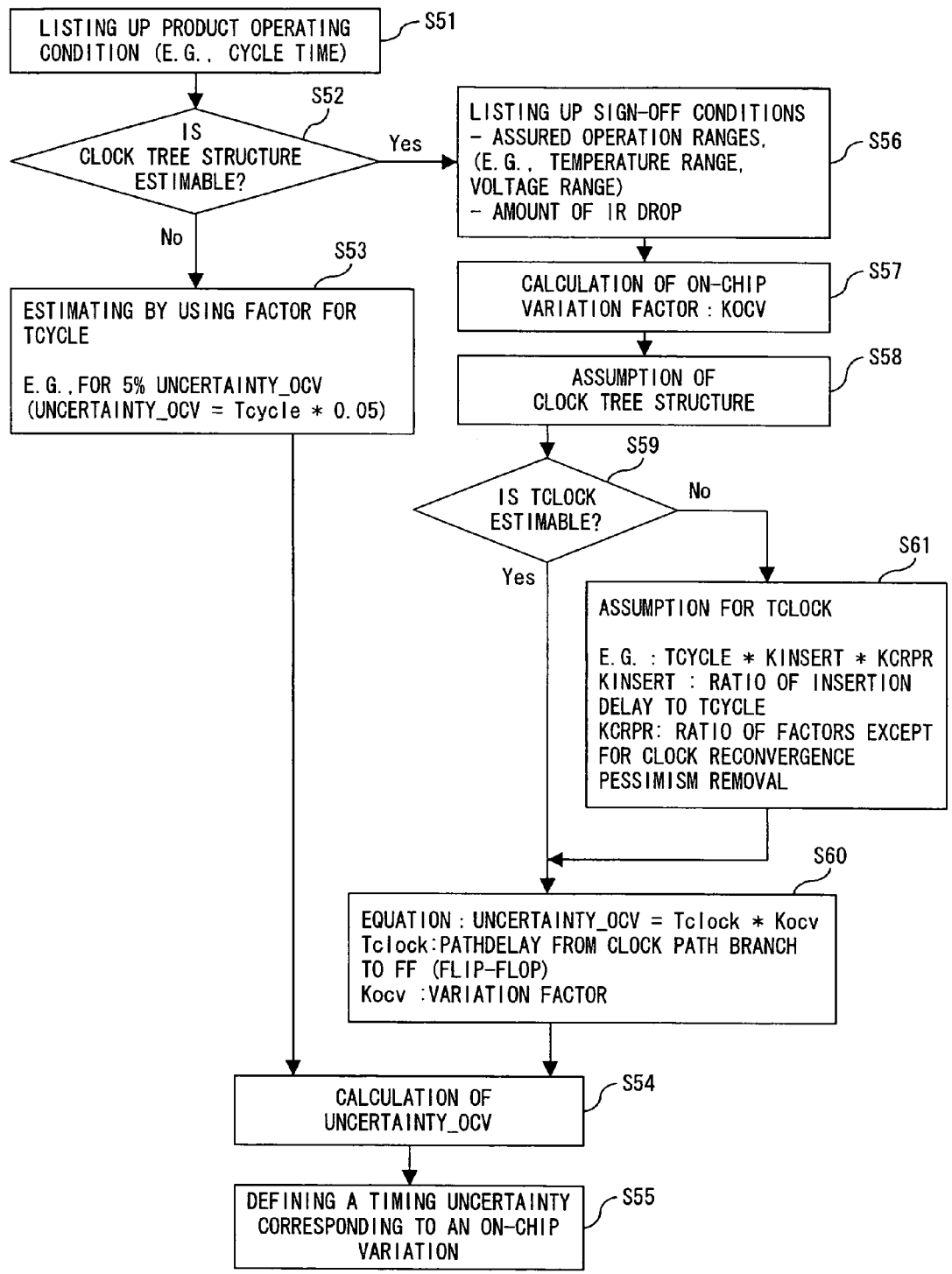
FIG. 8 shows a flow chart for defining a timing uncertainty corresponding to an on-chip variation.

FIG. 8 shows a detail flow chart for estimating a timing uncertainty corresponding to an on-chip variation in the step S22 shown by FIG. 5. In FIG. 8, as the process starts, a cycle time, et cetera, operating conditions of a product are listed up in the step S51 and a judgment is given as to whether or not a "Clock Tree" structure is estimable in the step S52, and if not, a cycle time, i.e., a factor for Tcycle, is defined in the step S53. For this factor, 0.05 is defined as a 5% of the cycle time for the timing uncertainty, followed by a calculation thereof in the step S54, and the process is complete with a definition of the timing uncertainty corresponding to the OCV, i.e., on-chip variation, in the step S55.

While in the step S52 if a "Clock Tree" structure is estimable, then a sign-off condition is listed up, such as an operating range (e.g., temperature and voltage ranges) and an IR drop amount, in the step S56, followed by the step S57 in which an on-chip variation factor, Kocv, is calculated based on the aforementioned sign-off condition. Although this variation factor, Kocv, is one for calculating a timing uncertainty by multiplying Tclock, i.e., a clock delay time, an amount of variation is converted into a variation factor in the calculation based on the value of the sign-off condition listed up in the step S56. And, a certain "Clock Tree" structure is assumed in the step S58, a judgment is given in the step S59 as to whether or not a value of clock delay time, i.e., Tclock, can be extracted, and if yes, an equation of multiplying Tclock by Kocv for calculation of a timing uncertainty is obtained in the step S60. Note that the clock delay time, Tclock, indicates a delay time between a branching point, where the clock path branches from a common part, and a cell subjected to set a timing margin, e.g., a flip-flop, with the common part of the clock path being excluded. Then, a timing uncertainty is calculated by using the aforementioned equation in the step S54, followed by the step S55 in which the timing uncertainty is defined.

In case a Tclock is judged to be not extractable in the step S59, a Tclock is assumed in the step S61. In the assumption, a multiplication result is used for the value, i.e., the cycle time Tcycle multiplied by Kinsert by Kcrpr, where Kinsert is an insertion delay, that is, a ratio of delay time between the clock pin of the entire chip and a subject flip-flop to the cycle time, and Kcrpr is a value for considering the influence of "clock re-convergence pessimism removal", that is, a ratio of delay time except in the common part of the clock path. Then, by using the assumed Tclock, an equation for timing uncertainty is defined in the step S60, followed by the calculation in the step S54, and a timing uncertainty is defined in the step S55.

Figure 9:
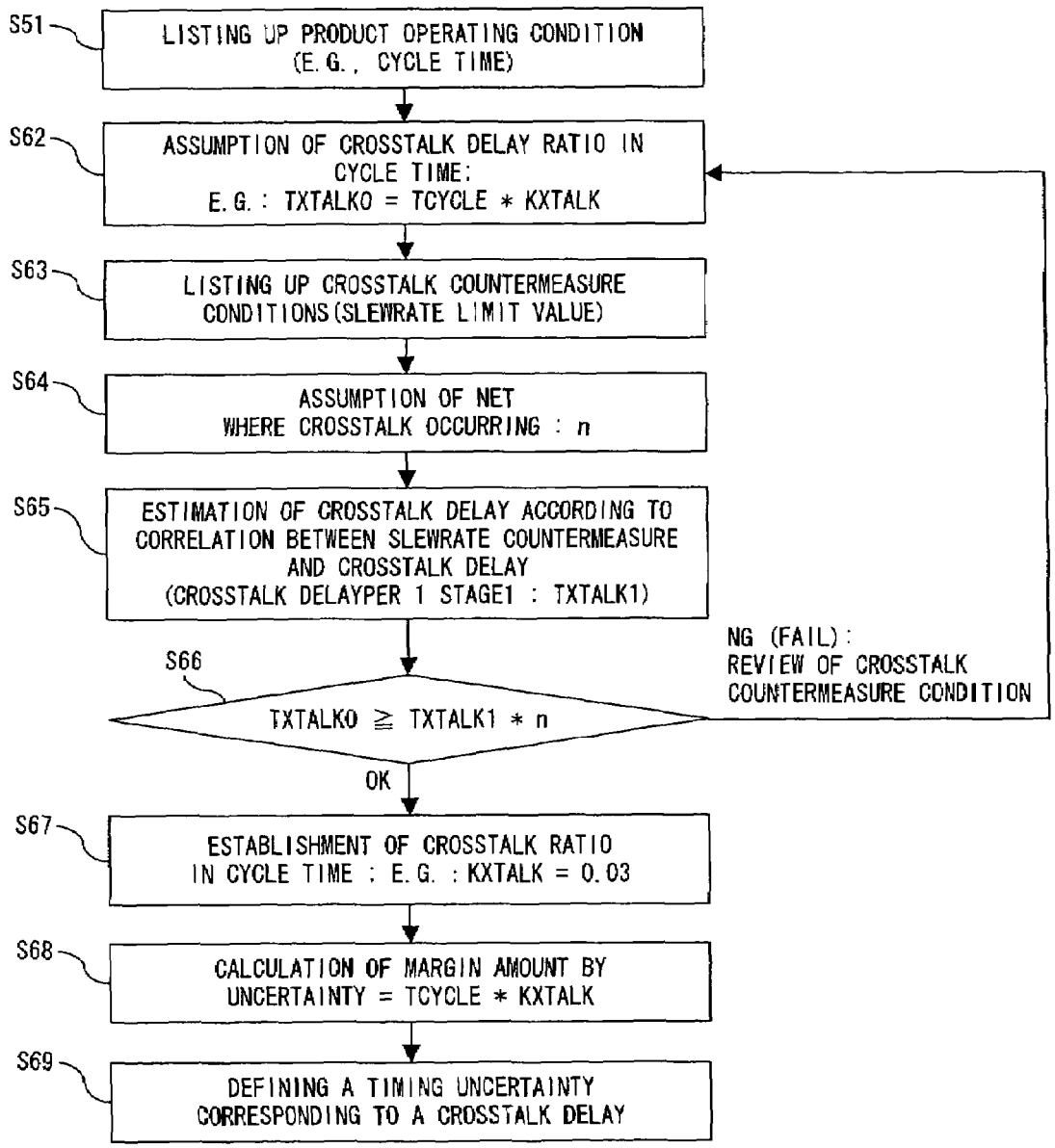
FIG. 9 shows a flow chart for defining a timing uncertainty corresponding to a crosstalk delay.

FIG. 9 shows a detail flow chart for defining a timing uncertainty corresponding to a "Crosstalk Delay" in the step S23 shown in FIG. 5. In FIG. 9, first as the process starts, an operating frequency, i.e., a cycle time, of the product specification is listed up in the step S51, followed by the step S62 in which a factor value, Kxtalk, indicating a ratio of "Crosstalk Delay" to a cycle time is assumed. For this factor value, although it is defined at 0.03 as an example in the step S67 for determining a contribution of "Crosstalk Delay" as described later, it can be defined at the same 0.03, or it can also be 0.02 for instance in this step S62.

Here, in the steps S62 through S66, processes are performed for judging whether or not a Crosstalk countermeasure condition is satisfied in order to define a factor, Kxtalk, in an appropriate range, that is, a range in which the Crosstalk countermeasure condition is established in the step S67.

In the step S63, a limit value of "slewrate" is listed up as a Crosstalk countermeasure condition. While a "slewrate" is defined as a waveform distortion, a "slew rate limit" value is listed up as 400 ps for instance here. Then the number of nets, n, where the crosstalk occurs is assumed in the step S64. In the step S65, a Crosstalk Delay is estimated by a correlation value between the "slewrate limit" value as the condition of a slew rate counter measure and a Crosstalk Delay. In this estimation, a cross talk delay, i.e., Txtalk 1, per stage is estimated, where one stage consists of a cell and a wiring for instance. There is a correlation of a fluctuation of delay time being generally commensurate with the value of slew rate in the presence of influence of noise. The Crosstalk Delay per stage is estimated in accordance with the correlation.

Then in the step S66, Txtalk 1, i.e., a Crosstalk Delay value per stage, and Txtalk 0, i.e., a Crosstalk value using the ratio assumed in the step S62 are compared, and if a multiplied value, i.e., Txtalk 1 times n, where n is the number of assumed nets, exceeds a value of Txtalk 0, then the judgment is that the crosstalk countermeasure condition is not satisfied, reverting the process back to the step S62 for retrial in the process and thereafter. That is, the value of the factor, Kxtalk, will be increased in the step S62 and processes of S63 and the latter will be repeated.

Whereas if the crosstalk countermeasure condition is judged to be satisfied in the step S66, then a Kxtalk value for determining an actual timing uncertainty is defined in the step S67. An actual timing margin is calculated in the step S68 and the process is complete with the timing uncertainty being determined in the step S69.

Figure 10:
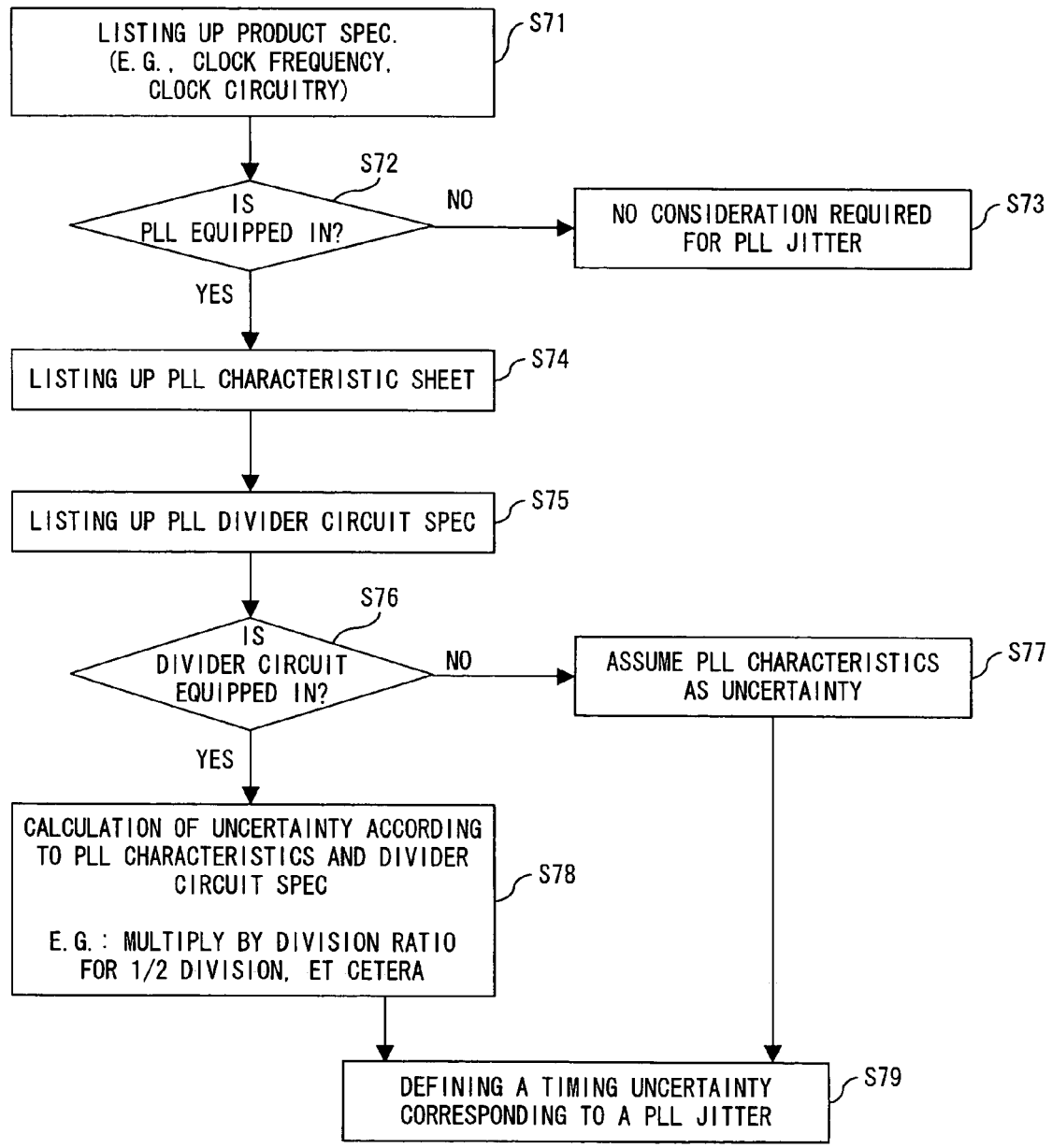
FIG. 10 shows a flow chart for defining a timing uncertainty corresponding to a PLL jitter.

FIG. 10 shows a detail flow chart for defining a timing uncertainty corresponding to a PLL jitter in the step S24 shown in FIG. 5. As described relating to FIG. 6, a PLL jitter is not required to consider for the hold check in the steps S18 and S19, because a data edge of the subject flip-flop (FF) and a clock edge are in synchronous with each other in the hold check. The same value of timing uncertainty corresponding to a PLL specification parameter common to all other processes is defined for use.

In FIG. 10, first, product specification such as clock frequency and clock circuitry are listed up in the step S71, then a judgment is given for a presence or absence of a macro, for instance, of PLL circuit in the step S72, and if absence, there is no need of considering for PLL jitter, thus ending the process in the step S73.

While if a presence of PLL circuit, the PLL specification sheet parameters are listed up in the step S74, PLL divider circuit specification is listed up in the step S75, a presence or absence of divider circuit is judged in the step S76 and if absence, then the PLL jitter in the PLL specification is considered as an uncertainty in the step S77 and an uncertainty value is defined accordingly in the step S79. If a presence of divider circuit, then an uncertainty is calculated according to the specification parameter and the specification of the divider circuit in the step S78. For example, if it is a ½ division output, a PLL jitter specification times the division ratio will be calculated for the uncertainty value and the uncertainty is defined in the step S79.

Figure 11:
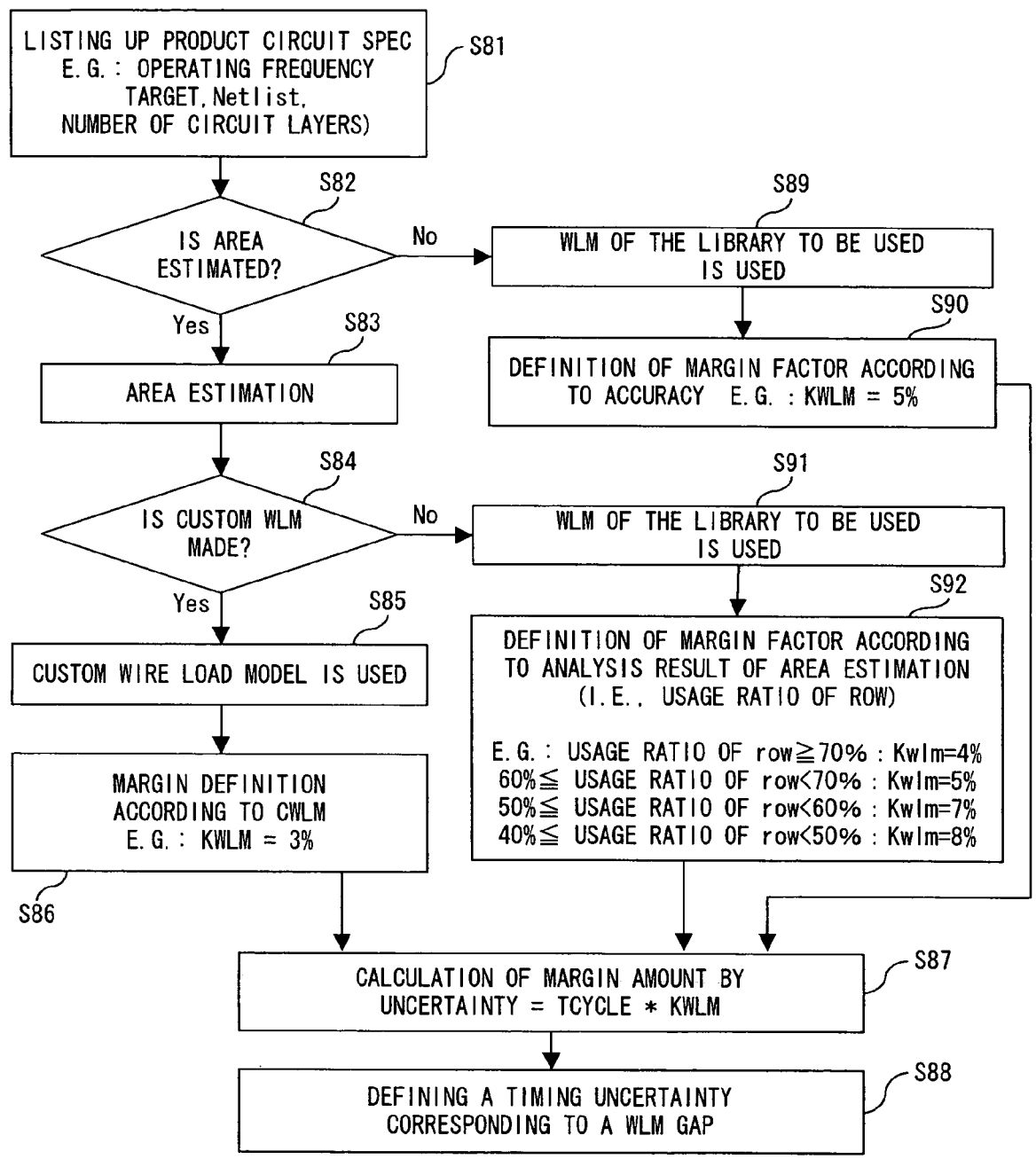
FIG. 11 shows a flow chart for defining a timing uncertainty corresponding to a gap between a temporary wiring and a permanent wiring.

FIG. 11 shows a detail flow chart for defining a timing uncertainty corresponding to a WLM gap, that is, a gap between a temporary wiring and a real wiring in the step S25 shown in FIG. 5. As described in FIG. 6, this process is actually used corresponding to the two processes in the steps S15 and S16 shown in FIG. 4 and a timing uncertainty according to this item will not be considered for the processes S17 and all the subsequent.

In FIG. 11, first, product circuit specification is listed up, such as target operating frequency, Net list, the number of circuit layers, et cetera, in the step S81, a judgment is given as to whether or not an area estimation is to be done in the step S82 and if it is, then an area estimation corresponding to area size of cell and circuit, and the number of gates is performed in the step S83, and a judgment is given in, the step S84 as to whether or not a Custom Wire Load Model will be made. A Custom Wire Load Model is the one specific to the particular product made in relation with the product layout configuration.

In the case of making a Custom Wire Load Model, the aforementioned model is used in the step S85, a factor, Kwlm, is set for example at 3% for defining a timing uncertainty value corresponding to the aforementioned model in the step S86, a timing margin value is calculated in the step S87, followed by the determination of a timing uncertainty in the step S88.

In the case of not performing an area estimation in the step S82, a Wire Load Model of the library to be used is used in the step S89, a factor value, Kwlm, is set according to the accuracy of the used library, for example at 5% in the step S90, a margin amount is calculated in the step S87 and the margin amount is determined in the step S88.

In the case of not making a Custom Wire Load Model in the step S84, a Wire Load Model of the library to be used is utilized in the step S91, and a factor, Kwlm, is set in the step S92 according to a row usage ratio, i.e., a ratio of area size of the used cells to the total row of the core part, obtained from the area size estimation performed in the step S83. For example, the aforementioned factor is set as 4% for the usage ratio of 70% or more, 5% for 60% to 70%, 7% for 50% to 60% and 8% for 40% to 50%. A margin amount is calculated in the step S87, followed by the step S88 in which a margin amount is accordingly determined.

In the present embodiment as described so far, a timing uncertainty is estimated in the early stage of design process according to conditions required for a sign-off verification, thereby reducing the number of iterations between the design and verification leading to a successful achievement of the timing conditions in the sign-off verification.

In addition, timing margins are managed in the same manner corresponding to each applicable item throughout the process up to the sign-off verification, with each item required for consideration of timing margin being made well defined, eliminating an accidental oversight. Furthermore, this enables version changes and trial fabrication data, utilization of the past knowledge and experiences such as trials, and feedback thereto.

Figure 12:
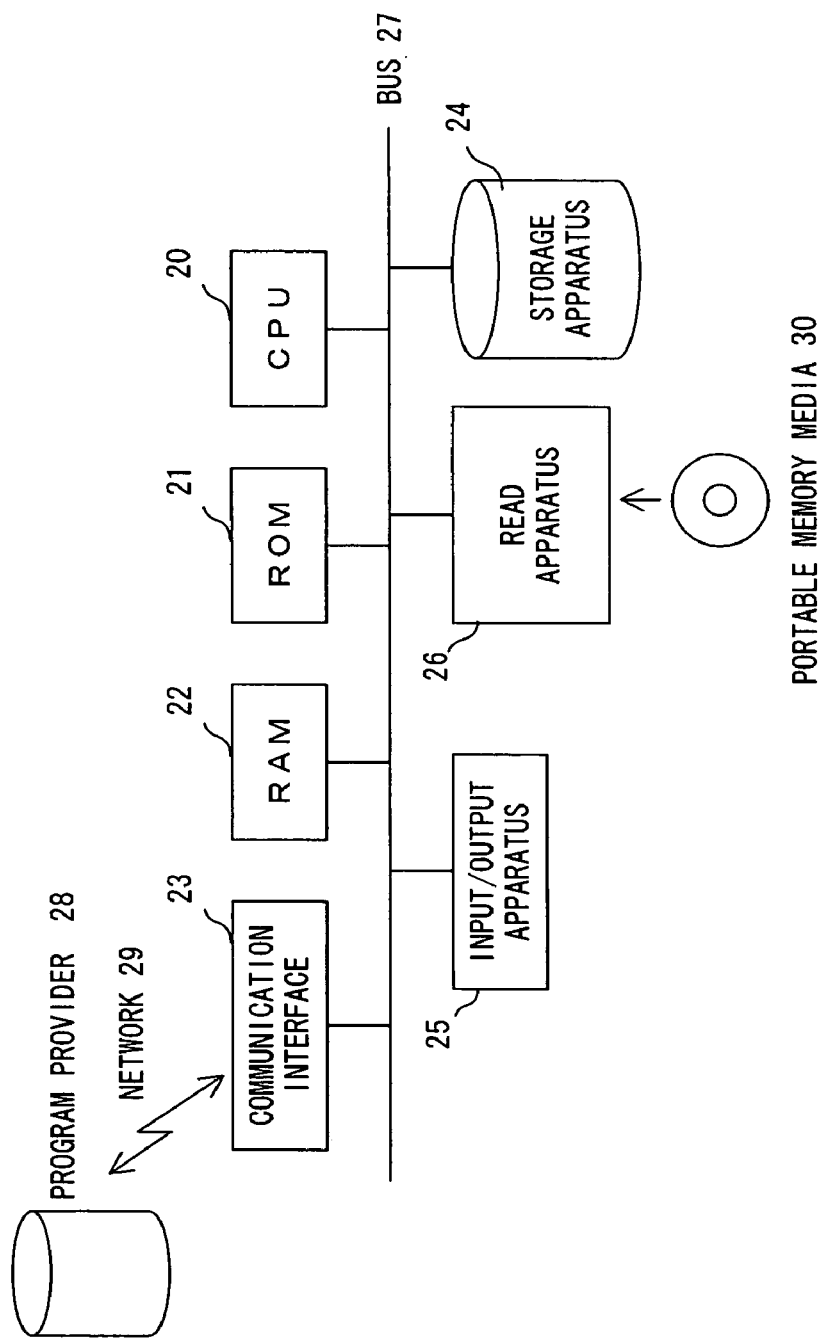
FIG. 12 describes a loading of a program on a computer for achieving the present invention.

While an LSI design method according to the present invention has been described in detail, the aforementioned design method is in fact enabled for operation in a common computer system. FIG. 12 illustrates a structural block diagram of such a computer system, i.e., a hardware environment.

In FIG. 12, a computer system comprises a central processing unit (CPU) 20, a read-only memory (ROM) 21, a random access memory (RAM) 22, a communication interface 23, a storage apparatus 24, an input/output apparatus 25, a portable memory media reader 26 and a bus 27 for interconnecting the above components.

For the storage apparatus 24, various forms of storage apparatuses can be applied such as a hard disk and a magnetic disk. In such storage apparatus or a ROM 21, programs as illustrated by the flow charts shown in FIGS. 3 through 5, and 7 through 11, and noted by claim 9 in the claims of the present invention can be stored so as to be executed by the CPU 20, thereby enabling an estimation of timing uncertainty, et cetera, according to the present embodiment.

Such a program can be stored in the storage apparatus 24 by the program supplier 28 by way of the network 29 and the communication interface 23, or can also be stored in a portable memory media 30 being distributed and sold off the shelf, set in the media reader 26 and executed by the CPU. For the portable memory media, diverse forms of memory media such as a CD-ROM, a flexible disk, an optical disk, a magneto-optical disk, a DVD, et cetera, are available. The LSI design method according to the present embodiment is enabled by the media reader 26 reading in the program stored in such storage media.

As described in detail, a timing uncertainty is estimated in the early stage of an LSI design process corresponding to the sign-off condition as well as the product specification and operating conditions of the LSI, followed by the design by using the timing uncertainty as appropriate according to the present invention, thereby reducing the number of iterations between the design and verification leading to a successful sign-off verification and contributing in great deal to shortening the time for the design and development of the LSI.

What is claimed is:

1. An LSI design method, comprising:
    estimating a timing uncertainty in an early design stage for each item of which an influence on timing is uncertain among respective items requiring consideration relating to establishment of timing; and
    defining a timing margin value in each design stage by using the timing uncertainty estimation result depending on whether or not an influence of the each item on timing has been determined, followed by proceeding with design in respective design stages accordingly,
    wherein the timing uncertainty is estimated corresponding to each item to be considered for establishing the timing margin value considering a condition of a product specification, an operating condition and a sign-off condition of an LSI prior to a logic synthesis stage; and
    the timing uncertainty is estimated in the early design stage relating to an influence of on-chip variation.

2. The LSI design method in claim 1, wherein, in estimating a the timing uncertainty relating to an influence of clock skew as one of said respective items requiring consideration,
    a judgment is given as to whether or not a clock tree structure is estimable, and if not, a timing uncertainty is estimated corresponding to an operating frequency; and
    if estimable, the timing uncertainty is estimated corresponding to an operating frequency and the number of leaves in a clock tree.

3. The LSI design method in claim 1, wherein a degradation of delay caused by a supply source voltage drop is considered according to a stored content of library based on an amount of voltage drop.

4. An LSI design method, comprising:
    estimating a timing uncertainty in an early design stage for each item of which an influence on timing is uncertain among respective items requiring consideration relating to establishment of timing; and
    defining a timing margin value in each design stage by using the timing uncertainty estimation result depending on whether or not an influence of the each item on timing has been determined, followed by proceeding with design in respective design stages accordingly, wherein in estimating the timing uncertainty relating to an influence of on-chip variation as one of said respective items requiring consideration, a judgment is given as to whether or not a clock tree structure is estimable, and if not, the timing uncertainty is estimated corresponding to an operating frequency; and if estimable the timing uncertainty is estimated corresponding to an on-chip variation factor and a delay time in a path between a clock path branching point and a cell being subjected to a timing check.

5. An LSI design method, comprising:

estimating a timing uncertainty in an early design stage for each item of which an influence on timing is uncertain among respective items requiring consideration relating to establishment of timing; and defining a timing margin value in each design stage by using the timing uncertainty estimation result depending on whether or not an influence of the each item on timing has been determined, followed by proceeding with design in respective design stages accordingly, wherein in estimating the timing uncertainty relating to an influence of crosstalk delay as one of said respective items requiring consideration, a factor value corresponding to an operating frequency is assumed for calculating an assumed value of the timing uncertainty and a judgment is given as to whether or not a crosstalk delay countermeasure condition is satisfied by the assumed value; and if satisfied, the timing uncertainty is estimated by defining the factor value corresponding to the assumed value.

6. An LSI design method, comprising:

estimating a timing uncertainty in an early design stage for each item of which an influence on timing is uncertain among respective items requiring consideration relating to establishment of timing; and defining a timing margin value in each design stage by using the timing uncertainty estimation result depending on whether or not an influence of the each item on timing has been determined, followed by proceeding with design in respective design stages accordingly, wherein in estimating the timing uncertainty relating to an influence of phased locked loop jitter as one of said respective items requiring consideration, the timing uncertainty is estimated corresponding to a characteristic and circuit aspect of the phased locked loop.

7. An LSI design method, comprising:

estimating a timing uncertainty in an early design stage for each item of which an influence on timing is uncertain among respective items requiring consideration relating to establishment of timing; and defining a timing margin value in each design stage by using the timing uncertainty estimation result depending on whether or not an influence of the each item on timing has been determined, followed by proceeding with design in respective design stages accordingly, wherein in estimating the timing uncertainty relating to an influence of gap between a temporary and a real wirings as one of said respective items requiring consideration, a judgment is given as to whether or not an area estimation is performed, and if not, the timing uncertainty is estimated by setting a factor value corresponding to an operating frequency for calculating the timing uncertainty according to a wire load model;

while if an area estimation is performed, a judgment is given as to whether or not a wire load model specific to a subject LSI for design is made after the area estimation, and if not, the timing uncertainty is estimated by setting the factor value according to the wire load model and a result of the area estimation; and if a wire load model specific to a subject LSI for design is made based on a result of the area estimation, the timing uncertainty is estimated by setting the factor value according to the specific wire load model.

8. A program stored in a computer-readable medium for use in a computer for designing an LSI, for having the computer operate the steps of estimating a timing uncertainty in an early design stage for each item of which an influence on timing is uncertain among respective items requiring consideration relating to establishment of timing; and defining a timing margin value in each design stage by using the timing uncertainty estimation result depending on whether or not an influence of the each item on timing has been determined, followed by proceeding with design in respective design stages accordingly, wherein the timing uncertainty is estimated corresponding to each item to be considered for establishing the timing margin value considering a condition of a product specification, an operating condition and a sign-off condition of an LSI prior to a logic synthesis stage; and the timing uncertainty is estimated in the early design stage relating to an influence of on-chip variation.

9. A computer readable portable memory media for storing program for use in a computer for designing an LSI, for having the computer operate the steps of estimating a timing uncertainty in an early design stage for each item of which an influence on timing is uncertain among respective items requiring consideration relating to establishment of timing; and defining a timing margin value in each design stage by using the timing uncertainty estimation result depending on whether or not an influence of the each item on timing has been determined, followed by proceeding with design in respective design stages accordingly, wherein the timing uncertainty is estimated corresponding to each item to be considered for establishing the timing margin value considering a condition of a product specification, an operating condition and a sign-off condition of an LSI prior to a logic synthesis stage; and the timing uncertainty is estimated in the early design staae relating to an influence of on-chip variation.

* * * * *

UNITED STATES PATENT AND TRADEMARK OFFICE
CERTIFICATE OF CORRECTION

PATENT NO. : 7,257,789 B2
APPLICATION NO. : 11/014814
DATED : August 14, 2007
INVENTOR(S) : Toshikatsu Hosono et al.

It is certified that error appears in the above-identified patent and that said Letters Patent is hereby corrected as shown below:

Column 10, Line 46, before "the" delete "a".

Column 11, Line 10, after "estimable" insert --,--.

Column 12, Line 57, change "staae" to --stage--.

Signed and Sealed this

Twenty-fifth Day of December, 2007

JON W. DUDAS
*Director of the United States Patent and Trademark Office*